United States Patent [19]

Cosmo

[11] Patent Number: 4,488,766

[45] Date of Patent: Dec. 18, 1984

[54] HIGH DENSITY ZERO INSERTION FORCE CONNECTOR

[75] Inventor: Nicola Cosmo, Harrisburg, Pa.

[73] Assignee: AMP Incorporated, Harrisburg, Pa.

[21] Appl. No.: 429,360

[22] Filed: Sep. 30, 1982

[51] Int. Cl.³ .......................... H01R 13/38; H05K 1/12

[52] U.S. Cl. .................................................. 339/75 MP

[58] Field of Search ........ 339/75 MP, 176 MP, 74 R, 339/17 C; 29/874

[56] References Cited

U.S. PATENT DOCUMENTS

| | | | |
|---|---|---|---|
| 3,636,499 | 1/1972 | Winklebleck | 339/75 MP |
| 4,077,688 | 3/1978 | Cobaugh et al. | 339/74 R |
| 4,165,909 | 8/1979 | Yeager | 339/75 MP |
| 4,169,644 | 10/1979 | Bonhomme | 339/75 MP |
| 4,186,982 | 2/1980 | Cobaugh et al. | 339/17 C |
| 4,189,200 | 2/1980 | Yeager et al. | 339/75 MP |
| 4,355,856 | 10/1982 | Porter | 339/75 MP X |

FOREIGN PATENT DOCUMENTS

| | | | |
|---|---|---|---|
| 1440198 | 10/1968 | Fed. Rep. of Germany | 339/75 MP |
| 2247927 | 4/1973 | Fed. Rep. of Germany | 339/75 MP |
| 1174063 | 3/1959 | France | 339/75 MP |
| 1396528 | 6/1975 | United Kingdom | 339/75 MP |
| 639056 | 12/1978 | U.S.S.R. | 339/75 MP |

OTHER PUBLICATIONS

IBM Disclosure Bulletin, vol. 10, No. 9, Feb. 1968, Connector.

*Primary Examiner*—William R. Briggs
*Attorney, Agent, or Firm*—Donald M. Boles

[57] ABSTRACT

A high density circuit board edge connector having a very short electrical contact path is taught. Briefly stated, an insulative housing comprised of two parts have contained therein a cylindrical contact carrier being held in the housing by resiliently deformable spring steel members with the contact carrier having a series of slots therein by which a contact is fitted to. The contact is semi-circular in shape conforming to the configuration of the contact carrier. A camming device which is generally triangular in shape resides in one corner of the contact housing and through lateral movement parallel to the axis of the contact carrier urges the contact carrier and hence the contacts downwardly and outwardly while movement of the cam in the reverse lateral direction allows the spring steel members to urge the contact carrier and hence the contacts inwardly and upwardly. Disposed on the bottom wall of the housing are conductive posts which project through the housing and facilitate mounting of the assembly onto a mother circuit board. A daughter circuit board having conductive strips thereon is placed adjacent to the connector housing and upon lateral movement of the camming means the contact carrier having contacts contained thereon is urged downwardly and outwardly thereby in a wiping and contacting motion causes a portion of the contact to come in electrical communication with the conductive post and with the conductive strip, thereby providing electrical communication between the conductive strip of the daughter circuit board and the conductive post. The electrical path between the daughter board and the mother board through the contact is very short thereby minimizing inductive, capacitive and propagation delay effects. Additionally, the width of the contact is very small allowing large numbers of contacts to be placed closely next to each other thereby providing a very high density device.

10 Claims, 5 Drawing Figures

HIGH DENSITY ZERO INSERTION FORCE CONNECTOR

This invention relates, generally, to a circuit board edge connector assembly and more particularly to a zero insertion force connector assembly for high density contact arrangements.

While zero insertion force connectors are relatively common, they generally have a tendency to utilize arrangements and manufacturing procedures which are difficult to scale down to high density applications. This is generally due to the fact that contact or enclosure requirements necessitate that some critical components generally are large enough to accommodate stresses associated with the use of the connector. This, therefore, makes use of connectors such as found in U.S. Pat. No. 4,077,688 "Zero Force Connector For Circuit Board" issued Mar. 7, 1978 to Cobaugh et al and U.S. Pat. No. 3,636,499, "Zero Force Connector" issued Jan. 18, 1972 to Winklebleck difficult to effectively scale down for use in very high density situations. Additionally, electrical constraints such as long contact lengths as found in the Cobaugh patent may make this type of connector unsuitable.

The assembly of the present invention solves these and other problems by incorporating electrical contacts having very short contact lengths and having a very narrow width thereby allowing compact, high density usage.

It is therefore an object of this invention to provide a zero force insertion connector for a circuit board having small dimensions and a very short electrical contact path which minimizes inductive, capacitive, and propagation delay effects.

It is another object of the present invention to provide a connector assembly which is relatively simple to manufacture and assemble having a minimum number of individual parts or components.

It is still another object of the present invention to provide a connector assembly which has replaceable contacts.

It is a further object of the present invention to provide a connector assembly which in conjunction with utilizing very short circuit paths provides contact wiping action, automatic compensation to match the coefficient of expansion of the mother and daughter circuit board material, insertion of the daughter board from either the side of the top and requiring no tools to operate.

Accordingly, the present invention teaches and as an object of the present invention, a high density circuit board edge connector, comprising an insulative housing, a conductive post projecting from the housing, a circuit board having a conductive strip contained thereon and being receivably received by the housing, a contact carrier disposed in the housing for urging a conductive contact which is retained by the carrier into or out of electrical contact with the conductive post and the conductive strip, a conductive contact slidably slideable onto the carrier and being resiliently deformable so as to come into or out of electrical contact with the conductive post and the conductive strip thereby providing electrical communication between the post and the strip, and a cam disposed in the housing and engaging the contact carrier thereby moving the contact carrier and therefore the conductive contact and a contact carrier retainer attached to the contact carrier, the retainer being resiliently deformable so as to urgably urge the contact carrier and therefore the conductive contact out of electrical contact with the conductive post and the conductive strip.

BRIEF DESCRIPTION OF THE DRAWINGS

Reference is now made to the description of the preferred embodiment illustrated in the accompanying drawings in which.

DESCRIPTION OF THE PREFERRED EMBODIMENT

Figure 1:
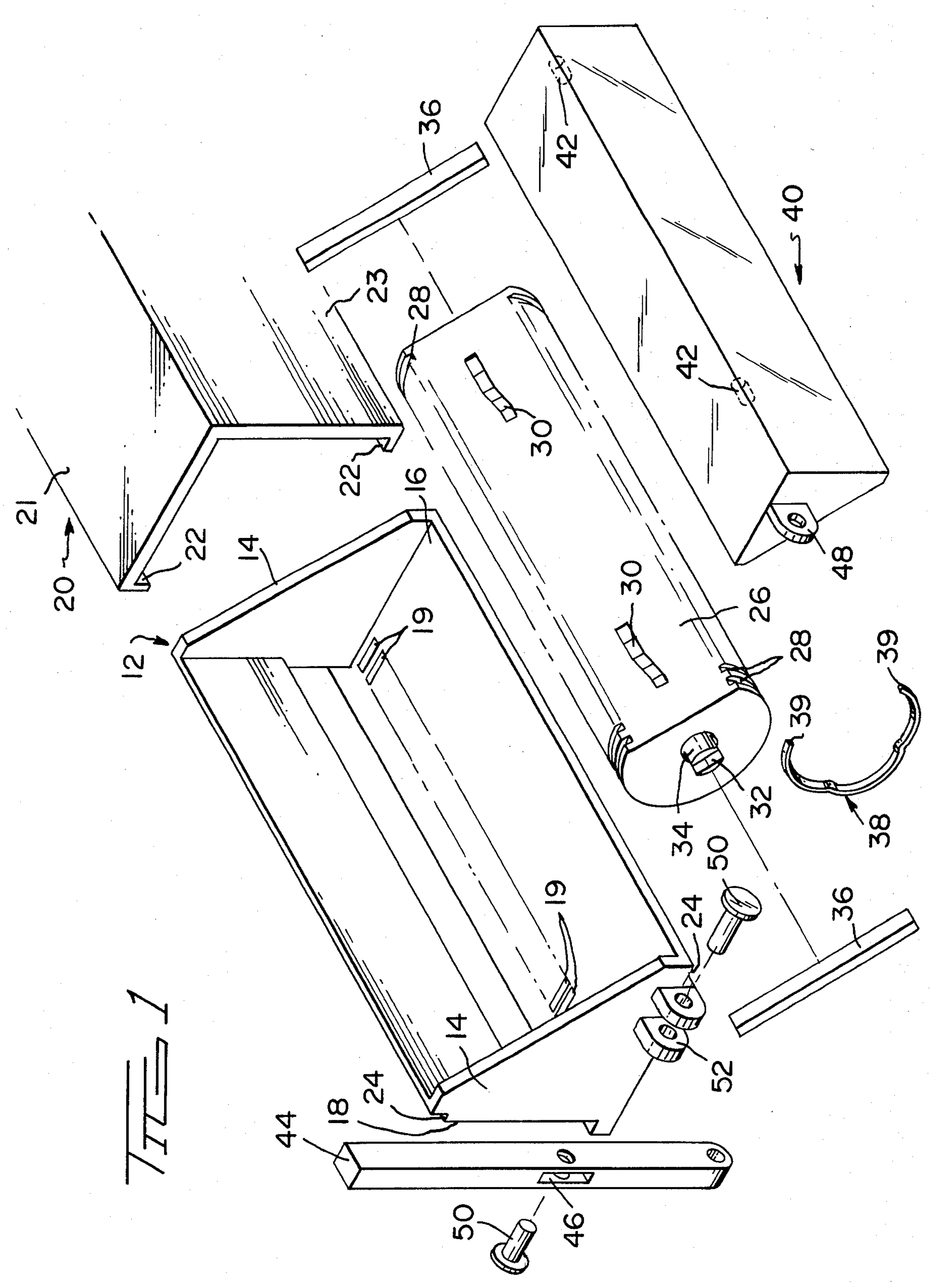
FIG. 1 is an exploded isometric view of the connector assembly of the present invention.

Referring now to FIG. 1 there is shown an exploded view of the connector assembly of the present invention. The connector is comprised of a connector main housing shown generally at 12 having side walls 14, a bottom 16, and a face 18. A connector lid shown generally at 20 is comprised of a connector lid top wall 21 and a connector lid side wall 23 and having connector lid retaining ledges 22. The lid retaining ledges 22 are formed so as to intersect with lid retaining recesses 24 contained on the connector main housing 12. A contact carrier 26 has contained thereon contact carrier slots 28 and camming recesses 30. Disposed on the ends of the contact carrier 26 are contact carrier spindles 32 having spindle slots 34 contained therein. The spindles 32 and the slots 34 are used to hold the contact carrier 26 in the connector main housing 12 while the camming recesses 30 are used to appropriately move the contacts 30 as will be discussed more fully below. Contact carrier retaining springs 36 are positioned inside the spindle slots 34. Disposed on the contact carrier 26 is a contact 38 which is curvilinearly shaped so as to slip onto contact carrier slots 28 thereby making the contact 38 replaceable. The contact 38 has a contact upper portion 39 which aids in proper deflection of the contact 38 as will be observed and more fully discussed below. The contact 38 may be stamped out of a piece of metal stock in the configuration shown or in the preferred embodiment of the present invention is bent into the shape shown. A cam 40 having cam actuators 42 disposed thereon is placed on top of the contact carrier 26 with the cam actuators 42 intersecting the camming recesses 30. A cam tab 48 is utilized to aid in movement of the cam 40 in a linear motion parallel to the axis of the contact carrier 26. The cam tab is inserted into a cam tab slot 46 contained in the lever 44. The purpose of the lever 44 is to make movement of the cam 40 and hence the contact carrier 26 relatively simple as well as having a force multiplying effect. The cam tab 48 is fixedly secured to the lever 44 by use of a fastener 50. The lever 44 is pivotably attached to the main housing 12 at the lever retaining tab 52 which is also fixedly secured by use of a fastener 50. Disposed in the bottom 16 of the connector main housing 12 are conductive posts 19 such as may be found in U.S. Pat. No. 4,186,982 "Contact With Split Portion For Engagement With Substrate" issued Feb. 5, 1980 to Cobaugh et al and which is incorporated by reference herein.

Figure 2:
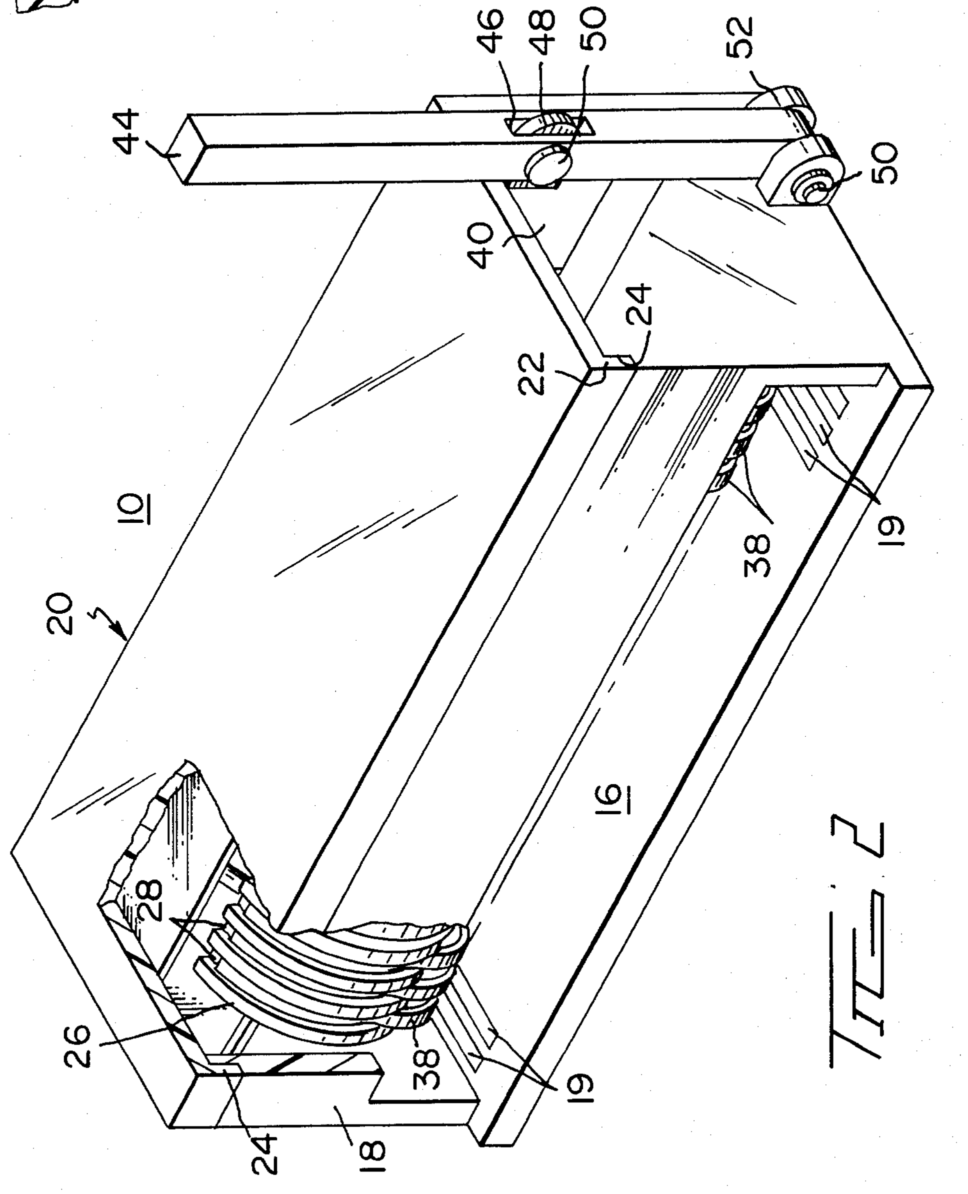
FIG. 2 is an isometric view having a part thereof cut away of the assembled connector of the present invention.

Referring now to FIG. 2 there is shown an isometric view having a partial section thereof cut away of the connector assembly 10 of the present invention. Here, it can be more readily seen how the various components of the connector assembly 10 engage with each other. The connector lid 20 is retained by the connector main housing 12 by use of the connector lid retaining ledges 22 intersecting with the lid retaining recess 24 and thereby allows access to interior of the assembly 10 should repair or replacement of the contacts 28 or other parts be necessary. Also evident is how the contacts 38 (which are shown slightly exaggerated in size for illustration purposes only) are disposed in the contact carrier slots 28 which are contained in the contact carrier 26. Evident is the positioning of the cam 40 and its relation to the lever 44 whereby movement of the lever 44 in the direction of the arrow by use of the lever retaining tabs 52 as a pivot point will cause the cam tab 48 contained in the cam tab slot 46 to cause lateral movement of the cam 40. Shown also is the position of the conductive posts 19 in the bottom 16 of the connector main housing 12.

Figure 3A:
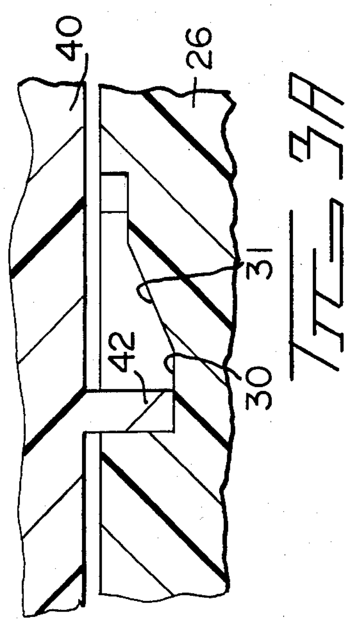
FIG. 3A is a cross-sectional partial view of the camming scheme of the present invention.
Figure 3:
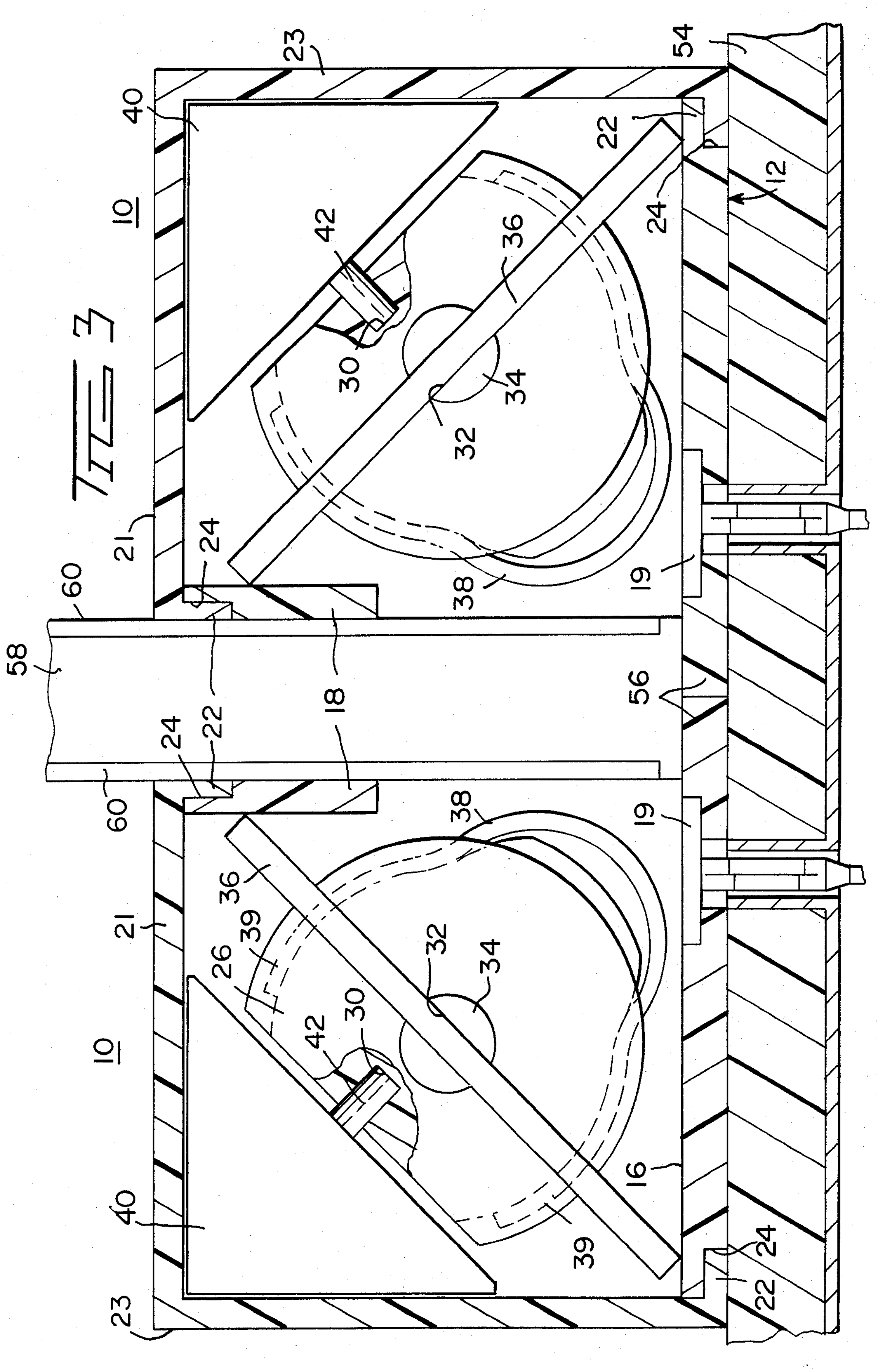
FIG. 3 is a side cross-sectional view of the connector of the present invention with the contacts in the open position in side by side relationship with a second connector assembly and a circuit board.

Referring now to FIG. 3, there is shown a pair of connector assemblies 10 in side-by-side relationship with the contacts 38 in the open position. Here it can be seen that the connector assembly 10 is mounted on a mother circuit board 54 which utilizes the compliant nature of a portion of the conductive posts 19 to fixedly secure the connector assembly 10 to the mother circuit board 54. The contact carrier 26 having the contact carrier spindles 32 with the spindle slots 34 contained therein is positioned inside the assembly 10 by use of the contact carrier retaining springs 36 which in the preferred embodiment of the present invention are comprised of a flexible spring like material such as spring steel and urge the contact carrier in the direction of the cam 40 and retain the contact carrier 26 and thereby the contacts 38 out of electrical contact with the adjacent conductive posts 19 and the conductive strips 60. A daughter board 58 rests on the daughter board ledge 56 of the connector main housing 12. Although a daughter board 58 is shown having conductive strips 60 on either side of the daughter board 58, it is to be understood that daughter boards such as 58 may have conductive strips 60 on one side only and therefore only one connector assembly 10 having sufficient contacts 38 to accommodate the conductive strips 60 is necessary. Shown also is the engagement of the cam actuator 42 with the camming recesses 30 and is shown more clearly in FIG. 3A.

Referring now to FIG. 3A there is shown a cross-sectional partial view of the camming scheme of the present invention. Here it can be seen that movement of the cam 40 to the right (in the direction of the arrow) will cause cam actuator 42 to ride along the camming recess ledge 31 and cause movement of the contact carrier 26. Since the cam 40 is allowed to move in a direction parallel to the axis of the contact carrier 26 and the contact carrier 26 is allowed to move in a direction perpendicular to the cam (as well as slightly rotating due to a slight jog in the camming recess as shown in FIG. 1) 40 and the axis of the contact carrier 26, the contact carrier 26 is forced to move toward the conductive posts 19 and the conductive strips 60 in a downward and outward wiping motion.

Figure 4:
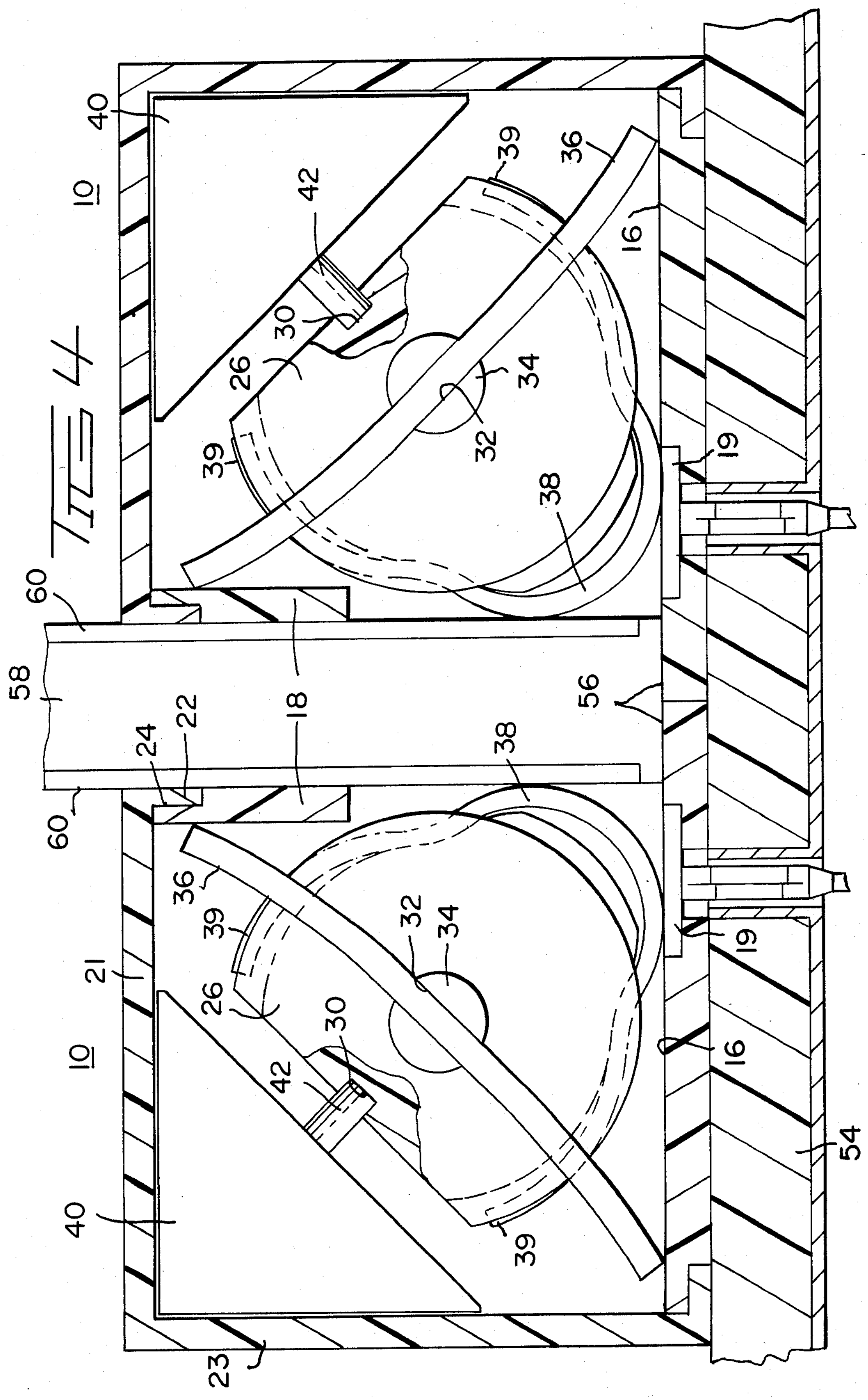
FIG. 4 is a cross-sectional view of the present invention similar to that of FIG. 3 with the contacts in the closed position.

Referring now to FIG. 4 there is shown a cross-sectional view of that shown in FIG. 3 with the contacts in the closed position. Here it is readily obvious that movement of the cam 40 has caused the contact carrier 26 to be urged downwardly and outwardly thereby causing the contacts 38 to come into electrical contact with a portion of the conductive posts 19 and the conductive strips 60. During the course of the movement of the contacts 38, they are forced to move in a wiping action across the top of the conductive posts 19 as well as a portion of the conductive strips 60. This wiping action therefore ensures a good electrical contact between the conductive strips 60 and the conductive posts 19. This electrical path established between the conductive strips 60 and the conductive posts 19 is readily observable as being of extremely short distance thereby minimizing or eliminating problems associated with long contact lengths such as propagation delay, resistance, and inductance when high speed circuitry is used. When the contacts 18 are urged into electrical communication with the conductive post 19 and the conductive strips 60 the contact carrier retaining spring 36 are flexibly moved in the direction of the contact carrier 26. Also the contact upper portions 39, due to the curvilinear shape of the contact 38 in relation to the contact carrier slots 28 are urged radially outward thereby transferring force of a contact mating nature to the contact and the conductive post 38, 19 as well as the contact and the conductive strip 38, 60.

It is to be understood that many variations of the present invention may be utilized without departing from the spirit and scope of the present invention. For example, circuit boards may include any board, card, or substrate in which electrical circuit conductors are secured by printing, plating, or other suitable process. Additionally, the contacts may be comprised of any suitable metal such as gold or may be entirely comprised of, for example, plastic with a suitable conductive coating contained thereon. Further, the springs may be formed of any suitable resilient material. Also, other camming schemes such as, for example, rotary camming which would cause suitable movement of the contact carrier may be utilized. Further, different contact posts suitable for insertion with a mother board may be utilized as well as different materials for the housing other than plastic thereby accommodating thermal expansion which may be anticipated for a particular usage. Additionally, multiple assemblies may be utilized adjacent to each other thereby providing a ganging or serial combination. Further, the housing may be configured so as to not provide for contact replacement such as where the housing is of a one piece construction or once assembled is not readily disassemblable. Also, ribs may be interposed between the conductive posts to enhance electrical isolation as well as minimize potential post to post shorting from extraneous matter such as metal filings.

Therefore, in addition to the above enumerated advantages the disclosed invention produces a circuit board edge connector which is suitable for high density contact usage and which is itself compact, providing modular growth capabilities, accommodating thermal expansion as well as various circuit board constraints while also providing very short contact length which may be used to minimize inductive, capacitive or propagation delay effects which may be of concern.

What is claimed is:

1. A high density circuit board edge connector assembly, comprising:

an insulative housing;

conductive posts projecting from said housing;

a circuit board having conductive strips contained thereon, receivably received by said housing;

contact carrier means disposed in said housing for urging a conductive contact means retained by said carrier means into or out of electrical contact with said conductive post and said conductive strips;

conductive contact means disposed on said carrier means providing wiping electrical communication between said post and said strip;

camming means disposed in said housing and engaging said contact carrier means thereby moving said contact carrier means and thereby said conductive contact means so as to move said contact means into or out of electrical contact with said conductive posts and said conductive strip; and contact carrier retaining means attached to said contact carrier means, said retaining means being resiliently deformable so as to urge said contact carrier and therefore said conductive contact out of electrical contact with said conductive post and said conductive strip.

2. A device according to claim 1 wherein said conductive contact means is slidable onto said carrier means.

3. A device according to claim 1 wherein said carrier means is cylindrical having a recess contained therein so as to receive said conductive contact.

4. A device according to claim 1 or 2 or 3 wherein said conductive contact means is shaped so as to form a non-closed generally circular configuration so as to be slidable onto said carrier means.

5. A device according to claim 1 or 3 wherein said conductive contact means is resiliently deformable so as to come into electrical contact with said conductive posts and said conductive strip.

6. A device according to claim 1 or 3 wherein said conductive contact means has a form obtained by having been cut from and lifted out from a flat sheet of metal.

7. A device according to claim 1 wherein said conductive contact means is comprised of an electrically insulative material having an electrically conductive material disposed thereon.

8. A device according to claim 1 wherein said housing has a plurality of conductive posts contained therein, said contact carrier means having a series of recesses for retaining a corresponding number of conductive contact means, said carrier adapted for movement toward corresponding inductive posts and conductive strips.

9. A device according to claim 1 wherein said housing comprises a plurality of housing sections mounted on a second circuit board.

10. A device according to claim 1 wherein a plurality of connector assemblies are in side-by-side relationship to each other so as to electrically engage conductive strips contained on either side of said circuit board.

* * * * *